(12) United States Patent
Ho et al.

(10) Patent No.: US 9,530,511 B1
(45) Date of Patent: Dec. 27, 2016

(54) OPERATING METHOD OF MEMORY DEVICE

(71) Applicant: UNITED MICROELECTRONICS CORP., Hsinchu (TW)

(72) Inventors: Yen-Ting Ho, Taipei (TW); Sung-Bin Lin, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/969,584

(22) Filed: Dec. 15, 2015

(51) Int. Cl.
| | |
|---|---|
| *G11C 16/16* | (2006.01) |
| *G11C 16/14* | (2006.01) |
| *G11C 16/04* | (2006.01) |
| *H01L 29/792* | (2006.01) |
| *H01L 29/423* | (2006.01) |
| *G11C 16/10* | (2006.01) |
| *H01L 29/51* | (2006.01) |

(52) U.S. Cl.
CPC .......... *G11C 16/14* (2013.01); *G11C 16/0466* (2013.01); *G11C 16/10* (2013.01); *H01L 29/4234* (2013.01); *H01L 29/42364* (2013.01); *H01L 29/511* (2013.01); *H01L 29/518* (2013.01); *H01L 29/792* (2013.01)

(58) Field of Classification Search
CPC ............................. G11C 16/16; H01L 29/792
USPC ...................... 365/185.29; 257/324
See application file for complete search history.

(56) References Cited

U.S. PATENT DOCUMENTS

| | | | | |
|---|---|---|---|---|
| 7,329,914 B2* | 2/2008 | Shih | ................. | H01L 21/28282 257/288 |
| 7,791,129 B2* | 9/2010 | Terai | ................. | G11C 16/0466 257/323 |
| 8,471,328 B2* | 6/2013 | Chen | ................. | H01L 21/28282 257/324 |
| 8,723,249 B2* | 5/2014 | Chen | ................. | H01L 21/28282 257/324 |
| 8,837,220 B2* | 9/2014 | Wang | ................. | G11C 16/14 365/185.15 |
| 8,848,454 B2* | 9/2014 | Tsai | ................. | G11C 16/0416 365/185.28 |

(Continued)

OTHER PUBLICATIONS

Chae H.S. et al., "Data retention behavior in the embedded SONOS nonvolatile memory cell," in Device Research Conference Digest, 2005. DRC '05. 63rd , vol. 1, no., pp. 35-36, Jun. 22-22, 2005 doi: 10.1109/DRC.2005.1553043.

*Primary Examiner* — Son Mai
(74) *Attorney, Agent, or Firm* — WPAT, PC; Justin King (57) ABSTRACT

An operating method of a memory device includes providing the memory device and performing an erase operation. The memory device includes a substrate, a gate dielectric layer formed on the substrate, a gate conductive layer formed on the gate dielectric layer, a charge trapping layer, a charge blocking layer, a source region, and a drain region. The charge trapping layer has a vertical portion formed on a sidewall of the gate conductive layer and a horizontal portion formed between the substrate and the gate conductive layer. The charge blocking layer is formed between the substrate and the charge trapping layer. The source and drain regions are formed in the substrate and located at two sides of the gate conductive layer respectively. Performing the erase operation includes applying an erase voltage to the gate conductive layer for inducing a BBHH injection and a FN hole tunneling.

16 Claims, 6 Drawing Sheets

(56) References Cited

U.S. PATENT DOCUMENTS

2003/0094662 A1\* 5/2003 Bae .................. H01L 21/28114
                                              257/408
2007/0297224 A1  12/2007 King et al.
2009/0050983 A1\* 2/2009 Terai ................. G11C 16/0466
                                              257/411
2012/0018795 A1\* 1/2012 Chen ................. H01L 21/28282
                                              257/324

\* cited by examiner

OPERATING METHOD OF MEMORY DEVICE

BACKGROUND

Technical Field

The present disclosure relates in general to an operating method of a memory device, and more particularly to an operating method of a memory device provided with excellent stability.

Description of the Related Art

A non-volatile memory can perform multiple times of program, read, or erase operations for data, and the stored data would not disappear after power is down. A silicon nitride layer is commonly used as the charge trapping layer in a memory device and is sandwiched between two silicon oxide layers for forming an ONO composite memory storage structure.

In order to complete an erase operation, the charges stored in the charge trapping layer need to be removed as completely as possible so as to provide a memory device having good performance as well as a long operating life time.

SUMMARY OF THE INVENTION

The present disclosure is directed to an operating method of a memory device. According to the operating method of the memory device of the present disclosure, a complete erase operation can be achieved, thereby providing an excellent and stable distinction between a program state and an erase state and thus in favor for the storage and interpretation of data, and the stored charges in the program state can maintain stable without easily being released, such that data can be stably stored over a long period of time.

According to an embodiment of the present disclosure, an operating method of a memory device is disclosed. The operating method of a memory device includes providing a memory device and performing an erase operation. The memory device includes a substrate, a gate dielectric layer, a gate conductive layer, a charge trapping layer, a charge blocking layer, a source region, and a drain region. The gate dielectric layer is formed on the substrate, and the gate conductive layer is formed on the gate dielectric layer. The charge trapping layer has a vertical portion formed on a sidewall of the gate conductive layer and a horizontal portion formed between the substrate and the gate conductive layer. The charge blocking layer is formed between the substrate and the charge trapping layer. The source region and the drain region are formed in the substrate and located at two sides of the gate conductive layer respectively. Performing the erase operation includes applying an erase voltage to the gate conductive layer for inducing a band to band hot hole (BBHH) injection and a Fowler-Nordheim (FN) hole tunneling.

The disclosure will become apparent from the following detailed description of the preferred but non-limiting embodiments. The following description is made with reference to the accompanying drawings.

DETAILED DESCRIPTION OF THE INVENTION

According to the operating method of the memory device of the embodiments of the present disclosure, a complete erase operation can be achieved, thereby providing an excellent and stable distinction between a program state and an erase state and thus in favor for the storage and interpretation of data, and the stored charges in the program state can maintain stable without easily being released, such that data can be stably stored over a long period of time. The identical or similar elements of the embodiments are designated with the same reference numerals. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

Figure 1:
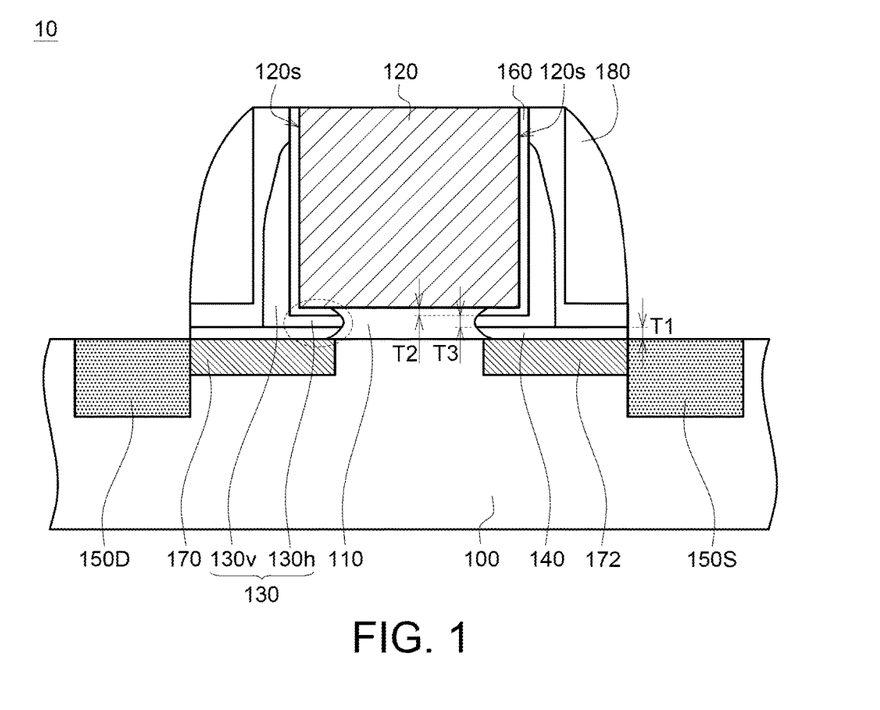
FIG. 1 shows a schematic drawing of a memory device according to an embodiment of the present disclosure.

According to the embodiments of the present disclosure, an operating method of a memory device is provided. The operating method includes providing a memory device 10 and performing an erase operation.

FIG. 1 shows a schematic drawing of a memory device according to an embodiment of the present disclosure. As shown in FIG. 1, the memory device 10 includes a substrate 100, a gate dielectric layer 110, a gate conductive layer 120, a charge trapping layer 130, a charge blocking layer 140, a source region 150S, and a drain region 150D. The gate dielectric layer 110 is formed on the substrate 110, and the gate conductive layer 120 is formed on the gate dielectric layer 110. The charge trapping layer 130 has a vertical portion 130v and a horizontal portion 130h. The vertical portion 130v is formed on a sidewall 120s of the gate conductive layer 120, and the horizontal portion 130h is formed between the substrate 100 and the gate conductive layer 120. The charge blocking layer 140 is formed between the substrate 100 and the charge trapping layer 130. The source region 150S and the drain region 150D are formed in the substrate 100 and located at two sides of the gate conductive layer 120 respectively.

In the embodiments, the charge blocking layer 140 has a thickness T1 of such as less than 40 Å. In an embodiment, the thickness T1 of the charge blocking layer 140 is, for example, 20-30 Å.

In the embodiments, performing the erase operation includes applying an erase voltage to the gate conductive layer 120 for inducing a band to band hot hole (BBHH) injection and a Fowler-Nordheim (FN) hole tunneling. Holes are introduced via the band to band hot hole injection and the FN hole tunneling to neutralize the trapped electrons in the charge trapping layer 130, thereby completing the erase operation, and the present state may be defined as, for example, state "1".

In some embodiments, the erase voltage is such as −4V to −8V. For example, in one embodiment, the erase voltage is, for example, about −5V.

In the embodiments, the operating method of the memory device may further include performing a program operation. Performing the program operation includes applying a program voltage to the gate conductive layer 120 for inducing a channel hot electron (CHE) injection. Via the channel hot electron injection, electrons can gain enough energy to surmount the charge blocking layer 140 and enter the charge trapping layer 130, such that the charge trapping layer 130 has stored charges (stored electrons), and the present state may be defined as, for example, state "0".

In some embodiments, the program voltage is such as 5V to 7V. For example, in one embodiment, the program voltage is, for example, about 6V.

In the embodiments, when performing the erase operation and the program operation, the operating method of the memory device may further include applying a source voltage to the source region 150S.

In some embodiments, the source voltage is such as 4V to 8V. For example, in one embodiment, the source voltage is, for example, about 5V.

According to the embodiments of the present disclosure, the charge blocking layer 140 has a relatively small thickness T1 of such as less than 40 Å or 20-30 Å, therefore a relatively large electric field can be generated without applying a very high erase voltage, as such the band to band hot hole injection and the FN hole tunneling can be both induced. Particularly, the FN hole tunneling can pull out electrons, which have been previously trapped in the interface regions between the charge trapping layer 130 and other layers, to be neutralized by the holes. With the FN hole tunneling in combination with the band to band hot hole injection, a more complete erase operation can be achieved.

In some embodiments, the memory device 10 may further include a charge tunneling layer 160. The charge tunneling layer 160 is formed between the gate conductive layer 120 and the charge trapping layer 130. In the embodiments, the charge tunneling layer 160 is such as a silicon oxide layer, the charge trapping layer 130 is such as a silicon nitride layer, and the charge blocking layer 140 is such as a silicon oxide layer. The three layers of the charge tunneling layer 160, the charge trapping layer 130, and the charge blocking layer 140 together form an ONO composite memory storage structure.

In the embodiments, the charge tunneling layer 160 has a thickness T2 of such as 20-30 Å, and the charge trapping layer 130 has a thickness T3 of such as 90-150 Å. A total thickness of the charge tunneling layer 160, the charge trapping layer 130, and the charge blocking layer 140 is such as 130-200 Å.

In some embodiments, the memory device 10 may further include two lightly-doped regions 170 and 172. The lightly-doped regions 170 and 172 are disposed in the substrate 100, and the two lightly-doped regions 170 and 172 are located at two opposite sides of the gate conductive layer 120.

In some embodiments, the memory device 10 may further include a spacer 180. The spacer 180 is for example a double-layered structure formed on the substrate 100 and the charge trapping layer 130.

Embodiments and comparative embodiments are provided hereinafter to further describe the operating method of the memory device according to the present disclosure.

Figure 2A:
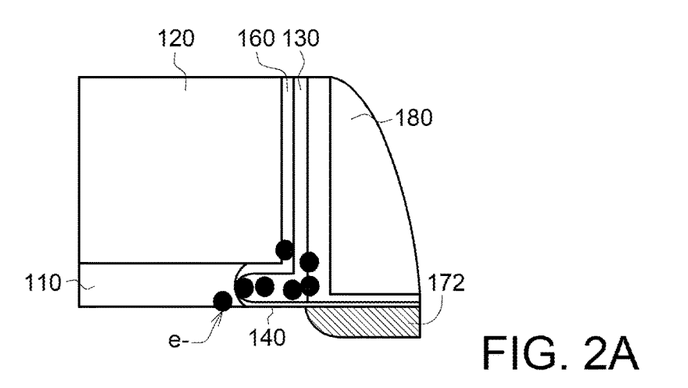
FIGS. 2A-2C illustrate a program/erase operations of a memory device according to a comparative embodiment of the present disclosure.
Figure 2B:
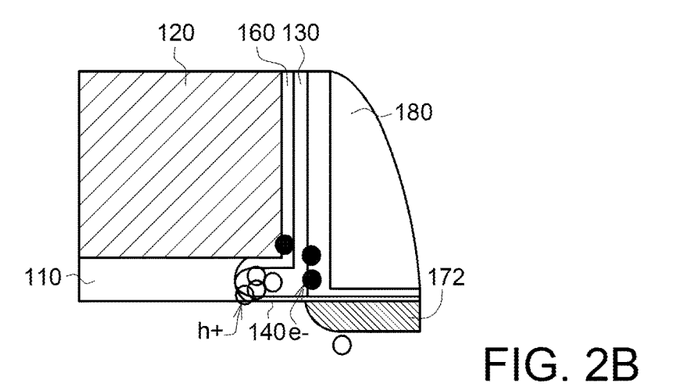
Figure 2C:
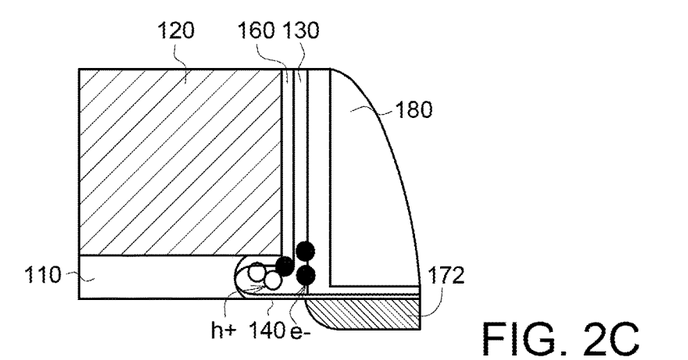
Figure 3A:
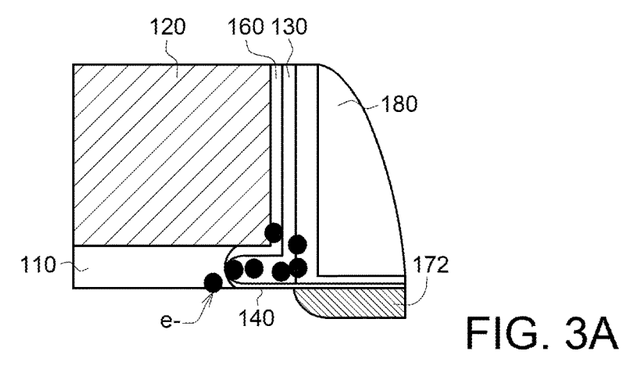
FIGS. 3A-3C illustrate a program/erase operations of a memory device according to an embodiment of the present disclosure.
Figure 3B:
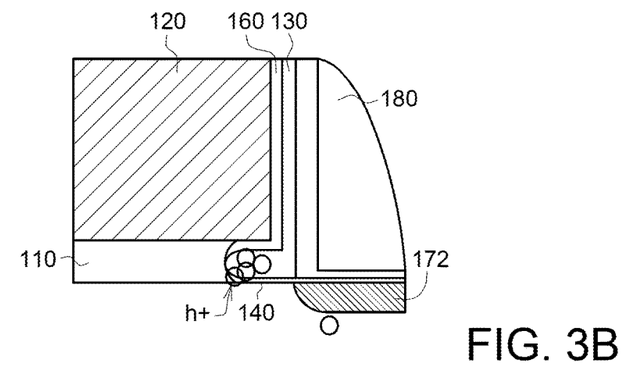
Figure 3C:
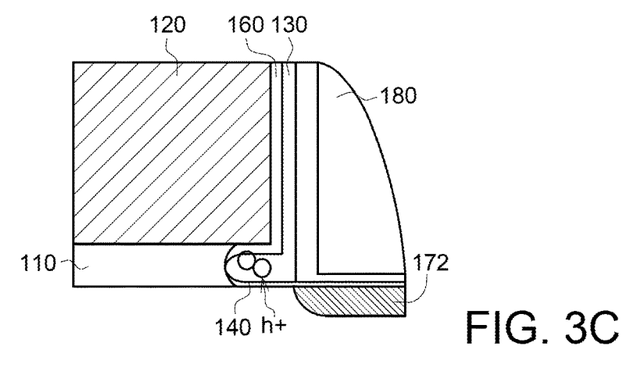

FIGS. 2A-2C illustrate a program/erase operations of a memory device according to a comparative embodiment of the present disclosure, and FIGS. 3A-3C illustrate a program/erase operations of a memory device according to an embodiment of the present disclosure. It is to be noted that the following embodiments are for exemplification only, not for limiting the scope of protection of the disclosure.

As shown in FIG. 2A, in a program operation, a program voltage is applied to the gate conductive layer 120 to induce the channel hot electron injection, and thus the charge trapping layer 130 would have stored charges (stored electrons e−). As shown in FIG. 2A, the electrons e− are distributed within the charge trapping layer 130, and some of the electrons e− are located at the interface region between the charge trapping layer 130 and the charge tunneling layer 160 and located at the interface region between the charge trapping layer 130 and the charge blocking layer 140.

Next, as shown in FIG. 2B, an erase operation is perform by a band to band hot hole injection. As shown in FIG. 2B, despite that a large amount of holes h+ are injected, yet only the band to band hot hole injection cannot neutralize all of the electrons e−. In other words, after the erase operation by only the band to band hot hole injection, the charge trapping layer 130 would have both the injected holes h+ and the remaining electrons e− trapped in the interface regions between the charge trapping layer 130 and adjacent layers.

Next, as shown in FIG. 2C, after the erase operation by the band to band hot hole injection is performed, the device is at an idle state, and the electrons e− trapped in the interface region between the charge trapping layer 130 and the charge tunneling layer 160 and in the interface region between the charge trapping layer 130 and the charge blocking layer 140 slowly release and are neutralized by the holes h+. In other words, the electrons that are not removed by the erase operation would be released at idle state, influencing the storage charge state of the charge trapping layer 130.

In contrast, FIGS. 3A-3C illustrate a program/erase operations of a memory device according to an embodiment of the present disclosure. As shown in FIG. 3A, in a program operation, a program voltage is applied to the gate conductive layer 120 to induce the channel hot electron injection, and thus the charge trapping layer 130 would have stored charges (stored electrons e−). As shown in FIG. 3A, the electrons e− are distributed within the charge trapping layer 130, and some of the electrons e− are located at the interface region between the charge trapping layer 130 and the charge tunneling layer 160 and located at the interface region between the charge trapping layer 130 and the charge blocking layer 140.

Next, as shown in FIG. 3B, an erase operation is perform by both a band to band hot hole injection and a FN hole tunneling. As shown in FIG. 3B, despite that a large amount of holes h+ are injected and only the band to band hot hole injection cannot neutralize all of the electrons e−, the FN hole tunneling can further pull out electrons, which have been previously trapped in the interface regions between the charge trapping layer 130 and other layers, to be neutralized by the holes h+. In other words, the FN hole tunneling in combination with the band to band hot hole injection can completely neutralize and remove the electrons e− introduced in the program operation, and thus a more complete erase operation can be achieved.

Next, as shown in FIG. 3C, when the device is at an idle state, the charge trapping layer 130 is substantially free of remaining trapped electrons e−. No electron e− would be released at the idle state, and thus the storage charge state of the charge trapping layer 130 can maintain stable and constant.

Figure 4A:
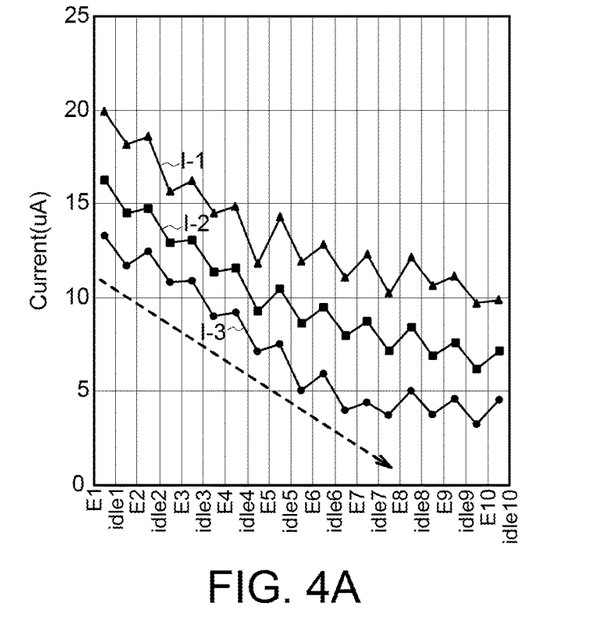
FIGS. 4A-4C illustrate the relationships between currents and erase/idle operations of the memory devices according to embodiments and comparative embodiments of the present disclosure.
Figure 4B:
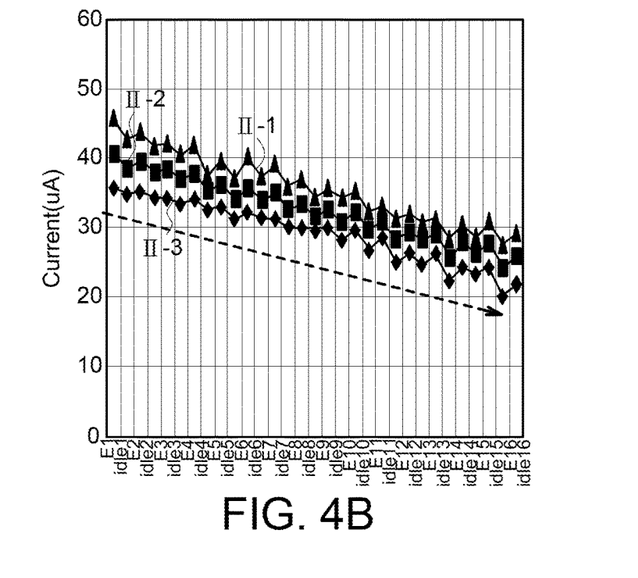
Figure 4C:
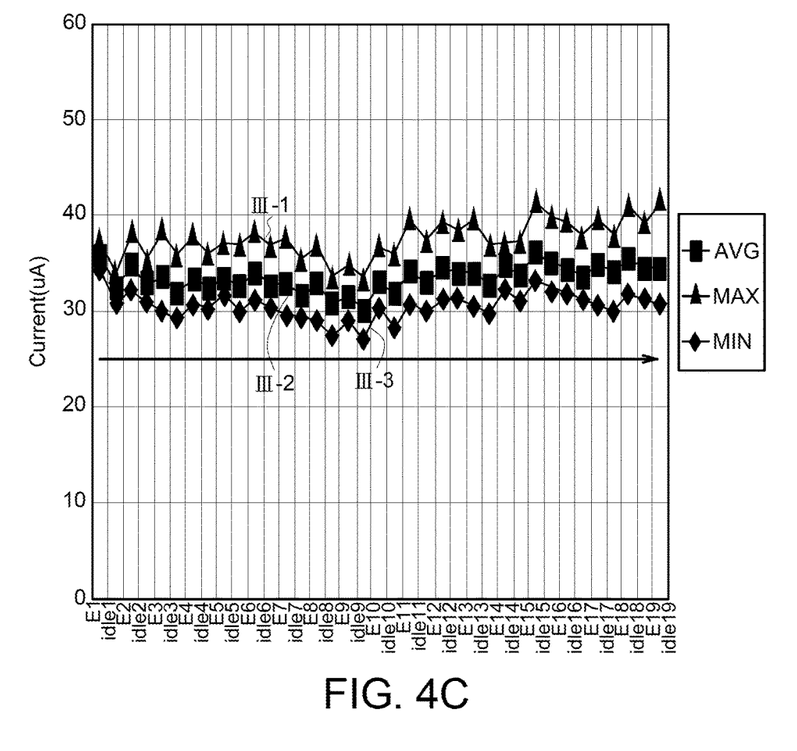

FIGS. 4A-4C illustrate the relationships between currents and erase/idle operations of the memory devices according to embodiments and comparative embodiments of the present disclosure. The following provides the measured memory cell currents of each of the memory devices after multiple program/erase/idle operations are repeatedly performed, for illustrating the operating method of the device of the present disclosure. It is to be noted that the following embodiments are for exemplification only, not for limiting the scope of protection of the disclosure.

In the memory device of the comparative embodiment as shown in FIG. 4A, the thicknesses of the charge tunneling layer, the charge trapping layer, and the charge blocking layer are respectively 8 nm, 10 nm, and 6 nm. In the memory device of the comparative embodiment as shown in FIG. 4B, the thicknesses of the charge tunneling layer, the charge trapping layer, and the charge blocking layer are respectively 6 nm, 10 nm, and 4 nm. In the memory device of the embodiment as shown in FIG. 4C, the thicknesses of the charge tunneling layer 160, the charge trapping layer 130, and the charge blocking layer 140 are respectively 4 nm, 12 nm, and 2 nm. In FIGS. 4A-4C, E1-E10 indicated on the x axis represent the first time of a program/erase operation performed to the tenth time of the program/erase operation performed. An idle step would be performed following every program/erase operation performed, and idle1-idle10 represent the idle steps respectively following the first time to the tenth time of the program/erase operation. An idle step lasts for about 12 hours.

As shown in FIGS. 4A-4B, curves I-1 and II-2 represent the maximum measured values, curves I-2 and II-2 represent the average measured values, and curves I-3 and II-3 represent the minimum measured values. As shown in FIGS. 4A-4B, the measured current values of the memory devices of the comparative embodiments decrease after every idle step following every program/erase operation. In addition, because each of the erase operations fails to achieve a complete erase, such that the remaining electrons in the memory storage structure (e.g. the charge trapping layer) results in that a following program/erase operation fails to achieve the memory cell current value which the previous program/erase operation achieves. Moreover, as the repeating times of the program/erase operations and idle steps increase, the memory cell current values correspondingly further decrease.

In contrast, according to the embodiments of the present disclosure, as shown in FIG. 4C, curve III-1 represents the maximum measured values, curve III-2 represents the average measured values, and curve III-3 represents the minimum measured values. As shown in FIG. 4C, the measured current values of the memory device of the embodiment can remain constant without decreasing after every idle step following every program/erase operation; that is because that each of the erase operations can achieve a complete erase, such that there is substantially no remaining electron trapped in the memory storage structure (e.g. the charge trapping layer). Accordingly, even with the repeating times of the program/erase operations and idle steps increase, the memory cell current values can still remain constant.

Figure 5:
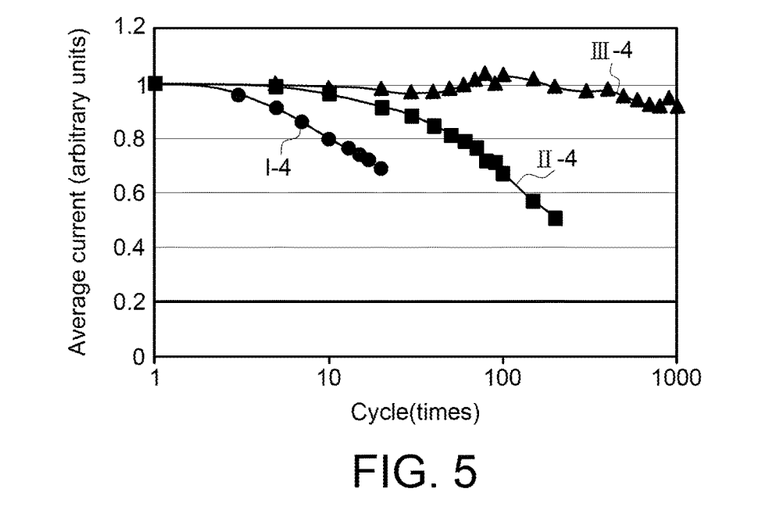
FIG. 5 illustrates the relationships between currents and program/erase operations of the memory devices according to an embodiment and comparative embodiments of the present disclosure.

FIG. 5 illustrates the relationships between currents and program/erase operations of the memory devices according to an embodiment and comparative embodiments of the present disclosure. The following provides the memory cell currents of each of the memory devices after multiple program/erase operations are repeatedly performed, for illustrating the operating method of the device of the present disclosure. It is to be noted that the following embodiments are for exemplification only, not for limiting the scope of protection of the disclosure.

In FIG. 5, the numbers indicated on the x axis represent the times of continuously performing program/erase operation(s), and no idle step would be performed following each of the program/erase operation(s). Curve I-4 represents the measured current values of the memory device of the comparative embodiment as shown in FIG. 4A. Curve II-4 represents the measured current values of the memory device of the comparative embodiment as shown in FIG. 4B. Curve III-4 represents the measured current values of the memory device of the embodiment as shown in FIG. 4C. The measured current values as shown in FIG. 5 are normalized. More specifically, the initial current of about 40 A is normalized to "1" as shown in FIG. 5.

As shown by the curves I-4 and II-4 in FIG. 5, even no idle step is performed, the erase operations of the memory devices of the comparative embodiments still fail to complete the erase. As such, after multiple times of performing program/erase operations, the memory cell current values dramatically decrease. In contrast, as shown by the curve III-4 in FIG. 5, the erase operations of the memory device of the embodiment can substantially complete the erase. As such, after performing ten times of program/erase operations, the memory cell current value can remain almost constant. Even with 1000 times of program/erase operations performed, the memory cell current value only drops by about 10%.

Figure 6:
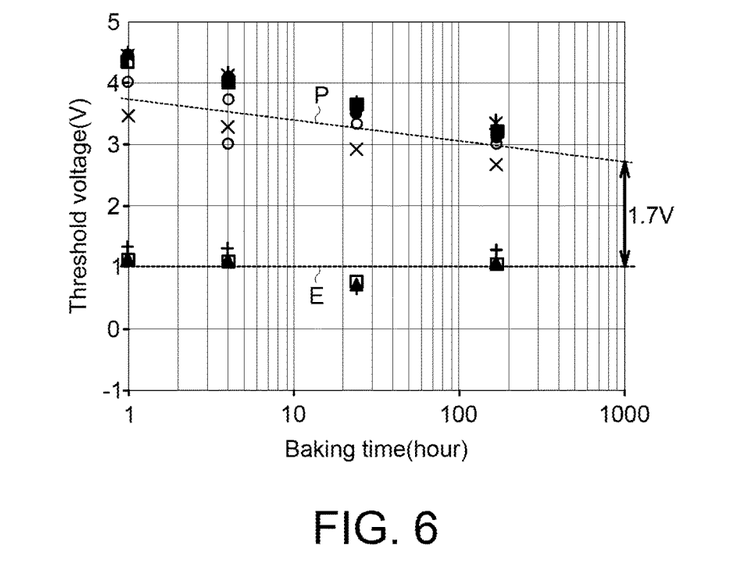
FIG. 6 illustrates the relationships between threshold voltage and baking time of a memory device according to an embodiment of the present disclosure.

FIG. 6 illustrates the relationships between threshold voltage and baking time of a memory device according to an embodiment of the present disclosure. The following provides the measured threshold voltages of the memory device of the embodiment as the memory device is baked at 150° C. for 1 hour, 5 hours, 15 hours, and 100 hours, respectively, for illustrating the operating method of the device of the present disclosure. It is to be noted that the following embodiments are for exemplification only, not for limiting the scope of protection of the disclosure.

In FIG. 6, curve P represents the measured and estimated threshold voltages of the memory device in program state, and curve E represents the measured and estimated threshold voltages of the memory device in erase state. As shown in FIG. 6, the threshold voltage of the memory device in erase state does not decrease even after being baked at 150° C. for 1000 hours, and the threshold voltage of the memory device in program state only slightly decreases. After baking at 150° C. for 1000 hours, the difference between the threshold voltages of the memory device in program state and in erase state only slightly decreases from about 2V to about 1.7V. In other words, the program state is highly distinct from the erase state of the memory device of the embodiment, thus providing easy interpretation of data. That is, the stored charges in the program state maintain stable without undesirably being released, such that data can be stably stored over a long period of time.

In summary, please refer to FIGS. 4A-4C, 5, and 6. As shown by the results in FIGS. 4A-4C and 5, the charge blocking layer 140 has a relatively small thickness of such as less than 40 Å or 20-30 Å, therefore a relatively large electric field can be generated without applying a very high erase voltage, as such the band to band hot hole injection and the FN hole tunneling can be both induced, and thus a more complete erase operation can be achieved. Meanwhile, as shown in FIG. 6, the thickness of the charge blocking layer 140 is not too thin to cause the stored charges in the charge trapping layer 130 unstable and undesirably release, resulting in that data cannot be stably stored over a long period of time. In other words, according to the operating method of memory device of the embodiments of the present disclosure, a complete erase operation can be achieved, thereby providing an excellent and stable distinction between a program state and an erase state and thus in favor for the storage and interpretation of data, and the stored charges in the program state can maintain stable without easily being released, such that data can be stably stored over a long period of time.

While the present disclosure has been described by way of example and in terms of the preferred embodiment(s), it is to be understood that the present disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operating method of a memory device, comprising:
   providing a memory device, comprising:
      a substrate;
      a gate dielectric layer formed on the substrate;
      a gate conductive layer formed on the gate dielectric layer;
      a charge trapping layer having a vertical portion formed on a sidewall of the gate conductive layer and a horizontal portion formed between the substrate and the gate conductive layer;
      a charge blocking layer formed between the substrate and the charge trapping layer, wherein the charge blocking layer has a thickness of less than 40 Å; and
      a source region and a drain region formed in the substrate and located at two sides of the gate conductive layer respectively; and
   performing an erase operation, comprising:
      applying an erase voltage to the gate conductive layer for inducing a band to band hot hole (BBHH) injection and a Fowler-Nordheim (FN) hole tunneling.

2. The operating method of the memory device according to claim 1, wherein the charge blocking layer has a thickness of 20-30 Å.

3. The operating method of the memory device according to claim 1, wherein the erase voltage is −4V to −8V.

4. The operating method of the memory device according to claim 1, further comprising:
   performing a program operation, comprising:
      applying a program voltage to the gate conductive layer for inducing a channel hot electron injection.

5. The operating method of the memory device according to claim 4, wherein the program voltage is 5V to 7V.

6. The operating method of the memory device according to claim 1, wherein the charge trapping layer is a silicon nitride layer.

7. The operating method of the memory device according to claim 1, wherein the charge blocking layer is a silicon oxide layer.

8. The operating method of the memory device according to claim 1, wherein the memory device further comprises a charge tunneling layer formed between the gate conductive layer and the charge trapping layer.

9. The operating method of the memory device according to claim 8, wherein the charge tunneling layer is a silicon oxide layer.

10. The operating method of the memory device according to claim 8, wherein the charge tunneling layer has a thickness of 20-30 Å.

11. The operating method of the memory device according to claim 8, wherein a total thickness of the charge tunneling layer, the charge trapping layer, and the charge blocking layer is 130-200 Å.

12. The operating method of the memory device according to claim 1, wherein the charge trapping layer has a thickness of 90-150 Å.

13. The operating method of the memory device according to claim 1, further comprising:
   applying a source voltage to the source region.

14. The operating method of the memory device according to claim 13, wherein the source voltage is 4V to 8V.

15. The operating method of the memory device according to claim 1, wherein the memory device further comprises two lightly-doped regions disposed in the substrate and located at two opposite sides of the gate conductive layer.

16. The operating method of the memory device according to claim 1, wherein the memory device further comprises a spacer formed on the substrate and the charge blocking layer.

* * * * *